(12) United States Patent
Hoshino et al.

(10) Patent No.: US 11,345,603 B2
(45) Date of Patent: May 31, 2022

(54) POLYCRYSTALLINE SILICON BAR, POLYCRYSTALLINE SILICON ROD, AND MANUFACTURING METHOD THEREOF

(71) Applicant: Shin-Etsu Chemical Co., Ltd., Tokyo (JP)

(72) Inventors: Naruhiro Hoshino, Niigata (JP); Tetsuro Okada, Niigata (JP); Masahiko Ishida, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 271 days.

(21) Appl. No.: 16/716,825

(22) Filed: Dec. 17, 2019

(65) Prior Publication Data

US 2020/0231450 A1 Jul. 23, 2020

(30) Foreign Application Priority Data

Jan. 18, 2019 (JP) .............................. JP2019-006931

(51) Int. Cl.
*C01B 33/035* (2006.01)
(52) U.S. Cl.
CPC .................................. *C01B 33/035* (2013.01)
(58) Field of Classification Search
CPC ...... B01J 35/0006; B01J 21/18; B01J 23/002; B01J 23/005; B01J 23/02; B01J 23/04; B01J 23/34; B01J 23/83; B01J 23/888; B01J 23/8892; B01J 27/22; B01J 27/232; B01J 37/0215; B01J 37/08; C09D 1/00
See application file for complete search history.

(56) References Cited

U.S. PATENT DOCUMENTS

| 5,310,531 | A | 5/1994 | Ikeda et al. |
| 11,167,994 | B2 * | 11/2021 | Miyao .................. C01B 33/035 |
| 2008/0286550 | A1 | 11/2008 | Sofin et al. |
| 2009/0269493 | A1 | 10/2009 | Mizuno et al. |
| 2012/0135635 | A1 | 5/2012 | Stubhan et al. |
| 2014/0004377 | A1 | 1/2014 | Kaito |
| 2017/0058427 | A1 | 3/2017 | Miyao et al. |
| 2017/0341943 | A1 | 11/2017 | Miyao et al. |

FOREIGN PATENT DOCUMENTS

| DE | 11 2015 005 391 T5 | 8/2017 |
| EP | 1 992 593 A2 | 11/2008 |
| EP | 2 226 155 A2 | 9/2010 |
| JP | 3-252397 A | 11/1991 |

(Continued)

OTHER PUBLICATIONS

Extended Search Report dated Apr. 20, 2020, issued in counterpart Application No. 19217243.5 (5 pages).

(Continued)

*Primary Examiner* — Anthony J Zimmer
*Assistant Examiner* — Logan E Laclair
(74) *Attorney, Agent, or Firm* — WHDA, LLP

(57) ABSTRACT

In a step of performing cylindrical grinding of a polycrystalline silicon bar 10 grown by a Siemens method, this cylindrical grinding step is performed such that a polycrystalline silicon rod 30, whose center axis $C_R$ is shifted from a center axis $C_0$ of a silicon core wire 20 by 2 mm or more, is manufactured.

12 Claims, 3 Drawing Sheets

(56) References Cited

FOREIGN PATENT DOCUMENTS

| | | |
|---|---|---|
| JP | 2008-285403 A | 11/2008 |
| JP | 2009-263149 A | 11/2009 |
| JP | 2012-521950 A | 9/2012 |
| JP | 2014-28747 A | 2/2014 |
| JP | 2015-214428 A | 12/2015 |
| JP | 2016-28990 A | 3/2016 |
| JP | 2016-121052 A | 7/2016 |
| JP | 2017-48098 A | 3/2017 |
| JP | 2017-48099 A | 3/2017 |

OTHER PUBLICATIONS

Office Action dated Oct. 12, 2021, issued in counterpart JP Application No. 2019-006931, with English translation. (6 pages).
Extended European Search Report dated Apr. 20, 2020, issued in counterpart EP Application No. 19217243.6 (5 pages).

* cited by examiner (A)    (B)

POLYCRYSTALLINE SILICON BAR, POLYCRYSTALLINE SILICON ROD, AND MANUFACTURING METHOD THEREOF

TECHNICAL FIELD

The present invention relates to a polycrystalline silicon rod grown by the Siemens method, in particular, a polycrystalline silicon rod suitable as a raw material for producing monocrystalline silicon by the floating-zone method (FZ method).

This application claims a priority of Japanese Patent Application No. 2019-006931 filed on Jan. 18, 2019 and incorporates all the contents of the application by reference.

BACKGROUND ART

Polycrystalline silicon is a raw material of monocrystalline silicon for semiconductor or solar cell silicon. As a method of manufacturing polycrystalline silicon, Siemens method is known. Siemens method is a method in which generally a silane source gas contacts a heated silicon core wire such that polycrystalline silicon is deposited on the surface of the silicon core wire using chemical vapor deposition (CVD) method.

In the Siemens method, two silicon core wires are set in a vertical direction and one silicon core wire is set in a horizontal direction to form a gate shape, both ends of the gate-shaped silicon core wires are connected to a core wire holder and fixed to a pair of metal electrodes arranged on a base plate. In general, a plurality of sets of gate-shaped silicon core wires is configured to be arranged in the reactor.

The gate-shaped silicon core wires are energized and heated to a deposition temperature of the polycrystalline silicon, and a mixture gas of, e.g., trichlorosilane and hydrogen, as a raw material gas, is brought into contact with the silicon core wires. Polycrystalline silicon is grown on the silicon core wires through vapor-phase epitaxy and a polycrystalline silicon rod having a desired radius is formed in an inverted U-shape.

When monocrystalline silicon is produced by the FZ method, both end parts, in a vertical direction, of polycrystalline silicon formed in an inverted U-shape are separated into two polycrystalline silicon bars to prepare cylinder-shaped polycrystalline silicon rods, and monocrystalline silicon is grown by the FZ method using the polycrystalline silicon rod as a raw material.

JP 2008-285403 A discloses that, if a large amount of needle crystals is deposited in the center part of the polycrystalline silicon rod, in a step of producing the monocrystalline silicon by the FZ method, unmelted needle crystals or their residues may migrate through the melting zone and induce the occurrence of a defect, resulting in the inhibition of single crystallization (generation of dislocation).

JP H3-252397 A discloses that, in the polycrystalline silicon rod used for producing the monocrystalline silicon by the FZ method, forming a coarsened silicon monocrystalline grain having an area at least equal to or greater than the minimum section area of the melting zone allows the melting zone to be uniformly melted and prevents the defect formation. However, this method requires preparation of a core wire of the monocrystalline silicon having a specific crystal orientation. In addition to that, the method has a problem of having a low deposition rate in growing the polycrystalline silicon rod.

Further, as described in JP 2012-521950 A, in a step of growing the polycrystalline silicon bar by the Siemens method, a contact heating region, which commonly appears at a contact point between graphite and silicon particularly in an initial stage of heating process, may melt or damage a fine silicon rod by mechanical stress. This causes a trouble of, for example, suspending the heating process and re-adapting the silicon deposition reactor to the complicated procedure.

DISCLOSURE OF INVENTION

That is, as described in JP 2008-285403 A and JP H3-252397 A, in a technique for producing the polycrystalline silicon rod for FZ, a crystal structure near the silicon core wire is very important, while as described in JP 2012-521950 A, an extreme caution is required at the start of the deposition reaction (reaction initial stage) of the polycrystalline silicon by the Siemens method.

The present invention has been made in view of such problems, and it is an object of the present invention to provide a polycrystalline silicon rod, which is suitable as a raw material for producing monocrystalline silicon by the FZ method, by using a very simple method without requiring special consideration to a crystal orientation or the like.

In order to resolve the problem, a polycrystalline silicon bar and a polycrystalline silicon rod in accordance with the present invention is a polycrystalline silicon bar or a polycrystalline silicon rod grown by a Siemens method and has a characteristic in that a center axis of the polycrystalline silicon bar or the polycrystalline silicon rod is shifted from a center axis of a silicon core wire by 2 mm or more.

Preferably a distance between the center axes is 5 mm or more, more preferably the distance between the center axes is 10 mm or more and further more preferably the distance between the center axes is 20 mm or more.

A manufacturing method of a polycrystalline silicon rod in accordance with the present invention comprises a step of performing cylindrical grinding of a polycrystalline silicon bar grown by a Siemens method, wherein the cylindrical grinding step is performed such that a center axis of the polycrystalline silicon bar is shifted from a center axis of a silicon core wire by 2 mm or more.

Also in this case, preferably a distance between the center axes is 5 mm or more, more preferably the distance between the center axes is 10 mm or more and further more preferably the distance between the center axes is 20 mm or more.

The present invention provides a polycrystalline silicon rod, which is suitable as a raw material for producing monocrystalline silicon by the FZ method, by using a very simple method without requiring special consideration to a crystal orientation or the like.

DETAILED DESCRIPTION

Embodiments for carrying out the present invention will be described below.

For the purpose of developing a polycrystalline silicon rod suitable as a raw material for producing monocrystalline silicon by the FZ method, the present inventors have conducted studies by focusing on a crystal structure near a core (near the center) of the polycrystalline silicon rod. However, it turns out that having various complicated conditions at the start of the deposition reaction (reaction initial stage) of the polycrystalline silicon by the Siemens method results in causing problems such as overturning of the polycrystalline silicon bar in the reaction furnace and generation of a spark.

Under such circumstances, further studies have led to an interesting result that, when the polycrystalline silicon rod of which the center axis is shifted from the center axis of the silicon core wire is used as a raw material used for growing the monocrystalline silicon by the FZ method, generation of dislocation hardly occurs in the process of growing the monocrystalline silicon by the FZ method.

Figure 1:
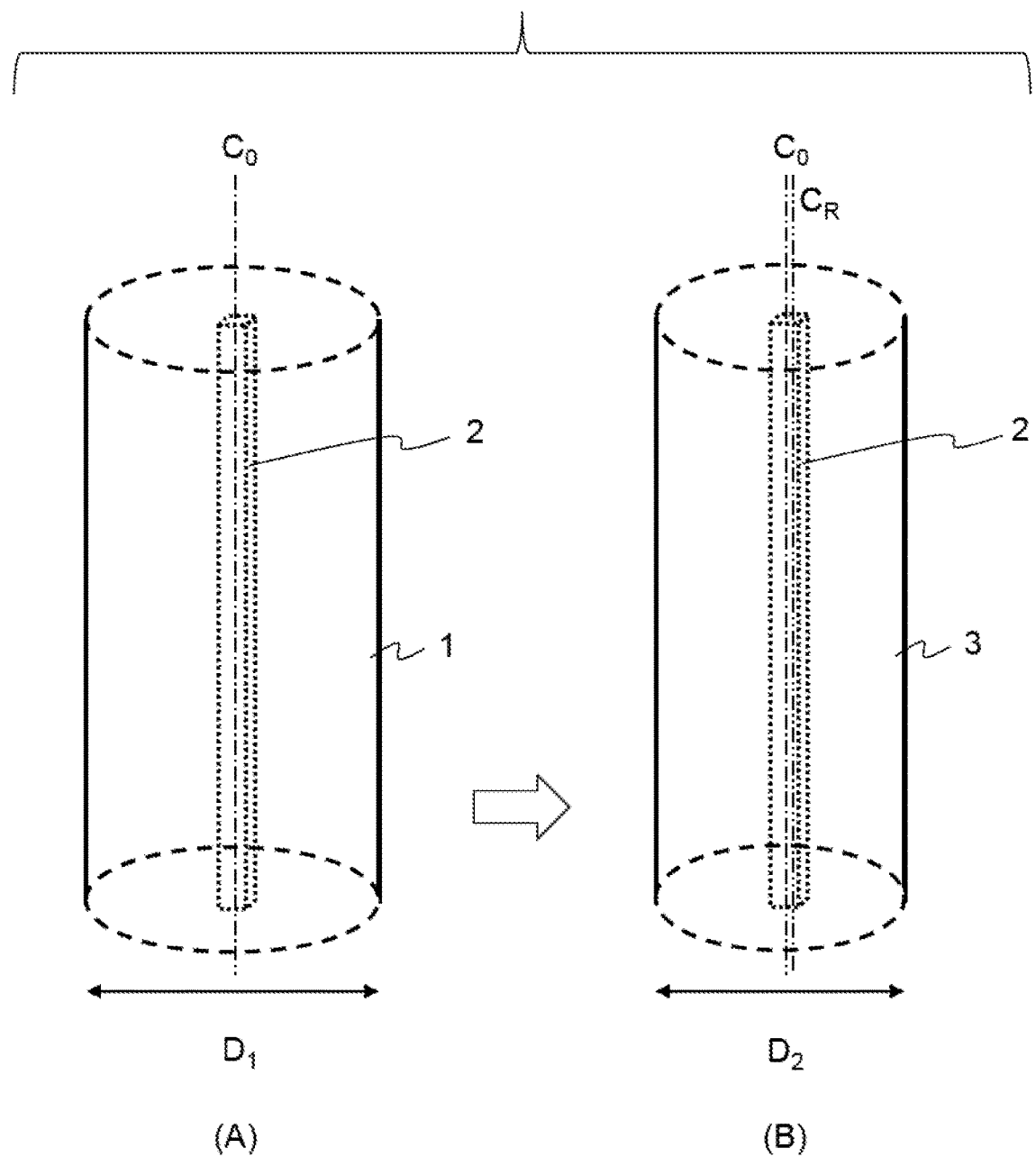
FIG. 1 is a diagram for explaining a conventional step of performing cylindrically grinding of a polycrystalline silicon bar grown by the Siemens method.

As shown in FIG. 1, when the polycrystalline silicon rod for producing the monocrystalline silicon by the FZ method is produced from the polycrystalline silicon bar obtained by the Siemens method, outer peripheral grinding processing is performed for forming a polycrystalline silicon bar 1 (diameter $D_1$) after deposition into a cylindrical shape. The center axis of the polycrystalline silicon bar 1 after deposition in an extending direction approximately corresponds to the center axis of a silicon core wire 2 in an extending direction (see FIG. 1(A)). Thus, when performing the normal outer peripheral grinding processing, the center axis ($C_R$ in the figure) of a polycrystalline silicon rod 3 (diameter $D_2$) obtained after the forming process approximately corresponds to the center axis ($C_0$ in the figure) of the silicon core wire 2 (see FIG. 1(B)).

The present inventors, by focusing on this point, intentionally tried to shift the center axis of the polycrystalline silicon rod from the center axis of the silicon core wire. As a result of examining this effect, the present inventors could confirm that the probability of generation of dislocation was significantly reduced.

That is, in the present invention, the center axis of the polycrystalline silicon rod grown by the Siemens method was set apart from the center axis of the silicon core wire by 2 mm or more.

Figure 2:
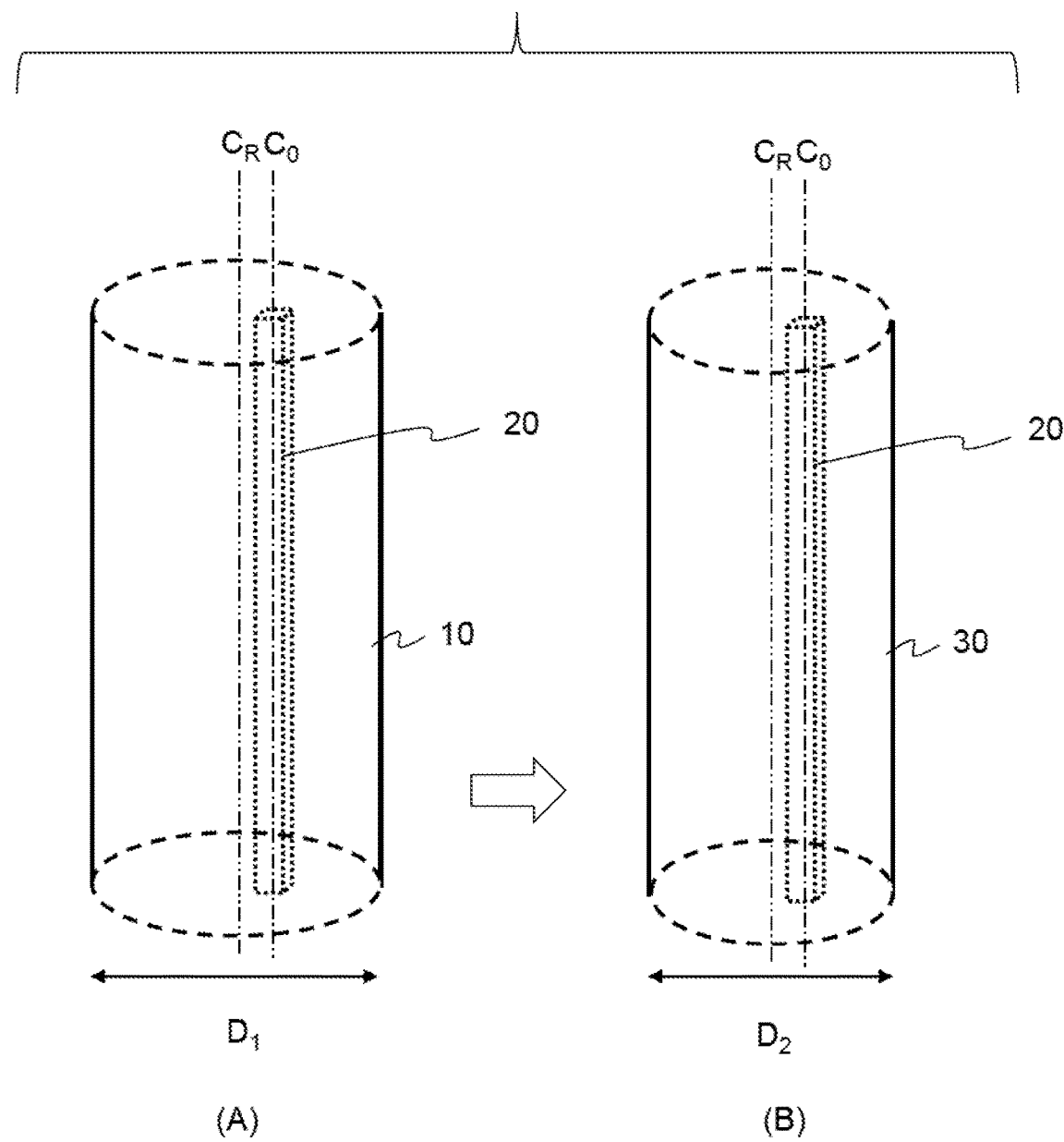
FIG. 2 is a diagram for explaining a step of the present invention of performing cylindrically grinding of the polycrystalline silicon bar grown by the Siemens method.

For this purpose, deposition conditions of the polycrystalline silicon by the Siemens method were examined so as to shift the center axis $C_R$ of a polycrystalline silicon bar 10 after deposition from the center axis $C_0$ of a silicon core wire 20 by 2 mm or more as shown in FIG. 2(A). The present inventors speculated that this could be achieved by changing the deposition rate of the polycrystalline silicon in a peripheral direction to the silicon core wire 20. Examples of a factor for adjusting the deposition rate in a vapor-phase growth reaction include a reaction gas concentration and a reaction temperature.

For example, a position of the gas supply nozzle may be changed for making a difference in the reaction gas concentration in order to change the deposition rate of the polycrystalline silicon in the peripheral direction to the silicon core wire 20. Note that changing the gas supply nozzle position normally makes a temperature of the supplied gas lower than the gas temperature in the furnace, making it possible to lower the reaction temperature also by this effect.

For making a difference in the reaction temperature in order to change the deposition rate of the polycrystalline silicon in the peripheral direction to the silicon core wire 20, radiation from other rods arranged in the reaction furnace is blocked or adjusted as a simple method. Arrangement of the rods may be adjusted in the reaction furnace or a shield or the like different from the reaction furnace wall may be separately installed.

When the deposition is performed under such conditions that the center axis $C_R$ of the polycrystalline silicon bar 10 after deposition is shifted from the center axis $C_0$ of the silicon core wire 20, due to originally existing displacement of two center axes (the nearest distance between $C_R$ and $C_0$), performing the normal outer peripheral grinding (cylindrical grinding) can still generate a polycrystalline silicon rod 30 of which the center axis $C_R$ is shifted from the center axis $C_0$ of the silicon core wire 20, giving rise to the advantage of reducing a cutting loss of the polycrystalline silicon caused at the time of the cylindrical grinding (see FIG. 2(B)).

Figure 3:
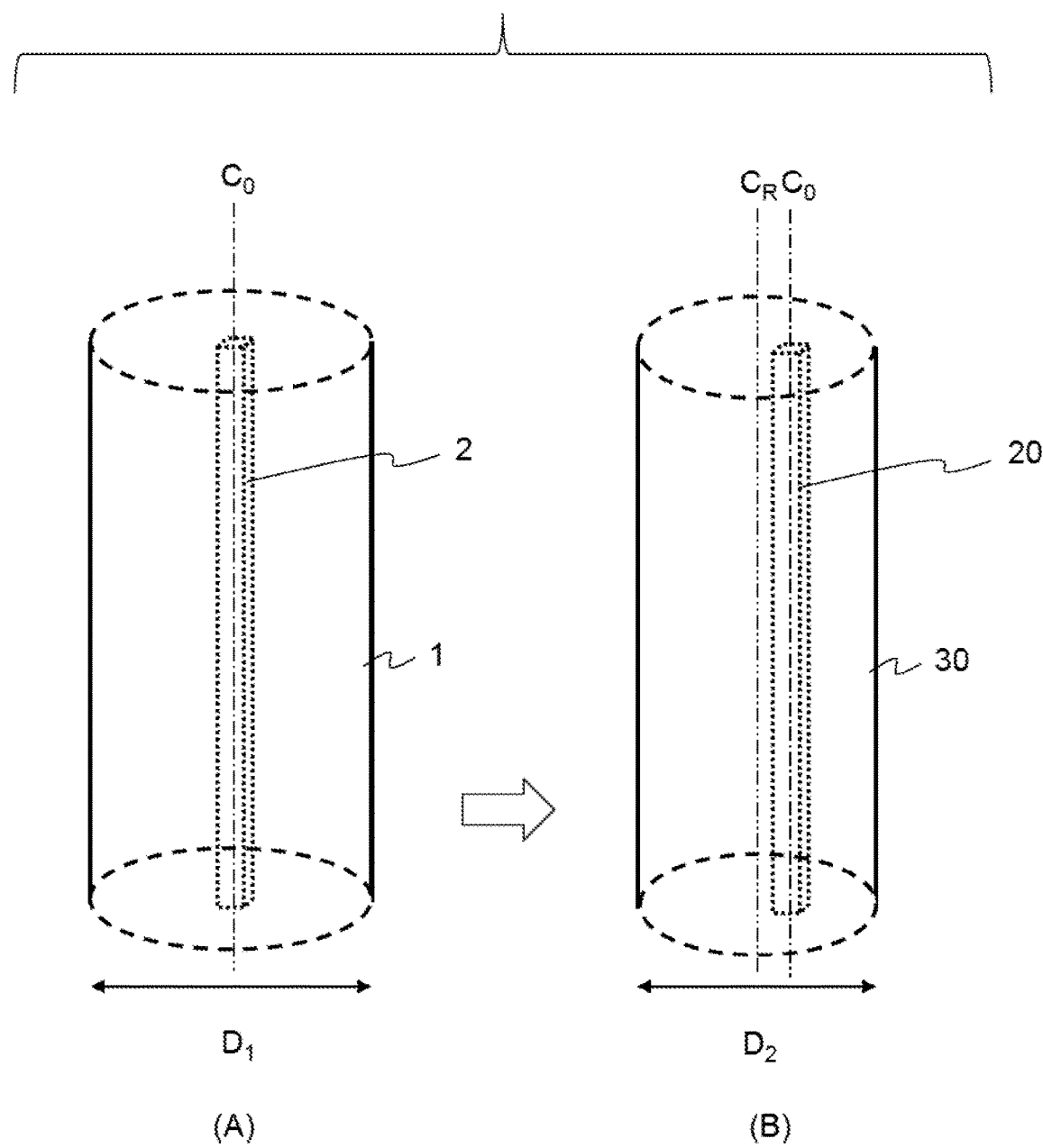
FIG. 3 is a diagram for explaining a step of the present invention of performing cylindrically grinding of the polycrystalline silicon bar grown by the Siemens method.

Note that, for shifting the center axis of the polycrystalline silicon rod from the center axis of the silicon core wire, as shown in FIG. 3, after growing the normal polycrystalline silicon bar 10 of which the center axis in the extending direction after deposition approximately corresponds to the center axis of the silicon core wire 20 in the extending direction (see FIG. 3(A)), the outer peripheral grinding processing may be performed to this polycrystalline silicon bar so as to shift the center axis $C_R$ of the polycrystalline silicon rod 30 from the center axis $C_0$ of the silicon core wire 20 (see FIG. 3(B)).

Note that a separation distance d between the above center axes is preferably 5 mm or more, more preferably 10 mm or more, further preferably 20 mm or more. There is no upper limit for the preferable separation distance. However, the separation distance can be appropriately selected depending on the polycrystalline silicon rod growth conditions and the cylindrical grinding conditions in order to prevent a cost increase and a loss rate increase.

EXAMPLES

[Experiment 1]

A polycrystalline silicon bar in an inverted U-shape was grown by the Siemens method using trichlorosilane as a raw material. Five polycrystalline silicon bars (diameter of about 175 mm) in an inverted U-shape were obtained in a single batch. Growth of the polycrystalline silicon bar was performed in this manner under the same deposition conditions for 5 batches (A to E), thereby producing 5 polycrystalline silicon rods per batch (a total of 25 rods). These polycrystalline silicon rods were each subjected to cylindrical grinding such that the separation distance between the center axis of the silicon core wire and the center axis of the polycrystalline silicon rod after the cylindrical grinding differed among the batches.

The monocrystalline silicon was grown by the FZ method using these 25 polycrystalline silicon rods as a raw material to examine a yield of each polycrystalline silicon rod.

Note that the term "yield" herein refers to a ratio of a length up to the position where dislocation occurs when a length of the monocrystalline silicon without the occurrence of dislocation is set to 100%. That is, the monocrystalline silicon without the occurrence of dislocation is evaluated as 100%.

Table 1 summarizes an average value of the above-mentioned yields obtained by growing the monocrystalline silicon using 5 polycrystalline silicon rods from each batch described above as a raw material.

TABLE 1

| Polycrystalline silicon rod | Distance between center axes (mm) | Monocrystalline silicon yield (%) |
|---|---|---|
| A | 20 to 30 | 100 |
| B | 10 to 20 | 94 |
| C | 5 to 10 | 87 |
| D | 2 to 5 | 81 |
| E | 0 | 70 |

As shown in Table 1, the yield increases as the separation distance between the center axis of the silicon core wire and the center axis of the polycrystalline silicon rod becomes longer. That is, in the step of performing the cylindrical grinding of the polycrystalline silicon bar grown by the Siemens method, the cylindrical grinding step is performed to produce the polycrystalline silicon rod of which the center axis $C_R$ is shifted from the center axis $C_0$ of the silicon core wire by 2 mm or more. This makes it possible to provide the polycrystalline silicon rod suitable as a raw material for producing the monocrystalline silicon by the FZ method.

Note that, as described above, the separation distance d between the center axes is preferably 5 mm or more, more preferably 10 mm or more, further preferably 20 mm or more.

[Experiment 2]

A polycrystalline silicon bar in an inverted U-shape was grown by the Siemens method using trichlorosilane as a raw material. Five polycrystalline silicon bars (diameter of about 155 mm) in an inverted U-shape were obtained in a single batch. Growth of the polycrystalline silicon bar was performed in this manner under the changed deposition conditions for 5 batches (F to J), thereby producing 5 polycrystalline silicon rods per batch (a total of 25 rods). These polycrystalline silicon rods were each subjected to cylindrical grinding such that the separation distance between the center axis of the silicon core wire and the center axis of the polycrystalline silicon rod after the cylindrical grinding differed among the batches.

The monocrystalline silicon was grown by the FZ method using these 25 polycrystalline silicon rods as a raw material to examine a yield of each polycrystalline silicon rod.

Note that the term "yield" herein also refers to a ratio of a length up to the position where dislocation occurs when a length of the monocrystalline silicon without the occurrence of dislocation is set to 100%. That is, the monocrystalline silicon without the occurrence of dislocation is evaluated as 100%.

Table 2 summarizes an average value of the above-mentioned yields obtained by growing the monocrystalline silicon using 5 polycrystalline silicon rods from each batch described above as a raw material.

TABLE 2

| Polycrystalline silicon rod | Distance between center axes (mm) | Monocrystalline silicon yield (%) |
|---|---|---|
| F | 20 to 30 | 100 |
| G | 10 to 20 | 90 |
| H | 5 to 10 | 85 |
| I | 2 to 5 | 80 |
| J | 0 | 67 |

As shown in Table 2, even when the deposition conditions of the polycrystalline silicon are changed, a tendency of increasing the yield with the longer separation distance between the center axis of the silicon core wire and the center axis of the polycrystalline silicon rod is clearly observed. That is, in the step of performing the cylindrical grinding of the polycrystalline silicon bar grown by the Siemens method, the cylindrical grinding step is performed to produce the polycrystalline silicon rod of which the center axis $C_R$ is shifted from the center axis $C_0$ of the silicon core wire by 2 mm or more. This makes it possible to provide the polycrystalline silicon rod suitable as a raw material for producing the monocrystalline silicon by the FZ method.

Note that, in this case as well, the separation distance d between the center axes is preferably 5 mm or more, more preferably 10 mm or more, further preferably 20 mm or more.

According to the present invention, there is provided a polycrystalline silicon rod, which is suitable as a raw material for producing monocrystalline silicon by the FZ method, by using a very simple method without requiring special consideration to a crystal orientation or the like.

REFERENCE SIGNS LIST

1, 10 Polycrystalline silicon bar
2, 20 Silicon core wire
3, 30 Polycrystalline silicon rod

The invention claimed is:

1. A polycrystalline silicon bar grown by the Siemens method and subjected to cylindrical grinding wherein a center axis of a silicon core wire is located 2 mm or more from the center axis of the a polycrystalline silicon bar.

2. The polycrystalline silicon bar according to claim 1, wherein a distance between the center axes is 5 mm or more.

3. The polycrystalline silicon bar according to claim 1, wherein a distance between the center axes is 10 mm or more.

4. The polycrystalline silicon bar according to claim 1, wherein a distance between the center axes is 20 mm or more.

5. A polycrystalline silicon rod grown by the Siemens method and subjected to cylindrical grinding wherein a center axis of a silicon core wire is located 2 mm or more from the center axis of the a polycrystalline silicon rod.

6. The polycrystalline silicon rod according to claim 5, wherein a distance between the center axes is 5 mm or more.

7. The polycrystalline silicon rod according to claim 5, wherein a distance between the center axes is 10 mm or more.

8. The polycrystalline silicon rod according to claim 5, wherein a distance between the center axes is 20 mm or more.

9. A manufacturing method of a polycrystalline silicon rod comprising a step of performing cylindrical grinding of a polycrystalline silicon bar grown by a Siemens method, wherein the cylindrical grinding step is performed such that a center axis of a silicon core wire is located 2 mm or more from the center axis of the a polycrystalline silicon bar.

10. The manufacturing method of a polycrystalline silicon rod according to claim 9, wherein the cylindrical grinding step is performed such that a center axis of a silicon core wire is located 5 mm or more from the center axis of the a polycrystalline silicon bar.

11. The manufacturing method of a polycrystalline silicon rod according to claim 9, wherein the cylindrical grinding step is performed such that a center axis of a silicon core wire is located 10 mm or more from the center axis of the a polycrystalline silicon bar.

12. The manufacturing method of a polycrystalline silicon rod according to claim 9, wherein the cylindrical grinding step is performed such that a center axis of a silicon core wire is located 20 mm or more from the center axis of the a polycrystalline silicon bar.

\* \* \* \* \*